(12) United States Patent
Luo et al.

(10) Patent No.: US 8,639,671 B2
(45) Date of Patent: Jan. 28, 2014

(54) DATABASE COMPRESSION

(75) Inventors: Congnan Luo, San Diego, CA (US); Like Gao, San Diego, CA (US); Yu Long, San Diego, CA (US); Judy Wu, San Diego, CA (US); Michael Leon Reed, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 317 days.

(21) Appl. No.: 12/825,989

(22) Filed: Jun. 29, 2010

(65) Prior Publication Data

US 2011/0320417 A1 Dec. 29, 2011

(51) Int. Cl.
*G06F 17/30* (2006.01)

(52) U.S. Cl.
USPC ............................................. 707/693

(58) Field of Classification Search
USPC ............................................. 707/693
See application file for complete search history.

(56) References Cited

U.S. PATENT DOCUMENTS

| | | | |
|---|---|---|---|
| 2008/0222136 A1* | 9/2008 | Yates et al. ................ | 707/5 |
| 2009/0043734 A1* | 2/2009 | Barsness et al. ............ | 707/3 |
| 2009/0043792 A1* | 2/2009 | Barsness et al. ............ | 707/101 |
| 2009/0043793 A1* | 2/2009 | Barsness et al. ............ | 707/101 |
| 2009/0193041 A1* | 7/2009 | Hornibrook et al. ........ | 707/101 |
| 2010/0161650 A1* | 6/2010 | Chaitanya et al. .......... | 707/769 |
| 2011/0029569 A1* | 2/2011 | Ganesh et al. .............. | 707/796 |

* cited by examiner

*Primary Examiner* — Mahesh Dwivedi
(74) *Attorney, Agent, or Firm* — Schwegman, Lundberg & Woessner, P.A.; Randy L. Campbell, Jr.

(57) ABSTRACT

Apparatus, systems, and methods may operate to receive a set of ordered user-selected compression rules as a compression rule set comprising at least one compression threshold condition, to create or transform a database object with rows to be selectively compressed according to the compression rules in the compression rule set (providing a transformed object), and to publish at least a portion of the transformed object to one of a storage medium or a display screen. Other apparatus, systems, and methods are disclosed.

18 Claims, 4 Drawing Sheets

```
                            ┌─ 110
CREATE TABLE ...

ALGOCOMPRESS <compression_function>
      ALGODECOMPRESS <decompression_function>
      (<column definitions>)
      [COMPRESSION OFF FOR ROWS WHEN (<conditions>)]

┌─ 120
ALTER TABLE ...
      ALGOCOMPRESS <compression_function>
      ALGODECOMPRESS <decompression_function>
      (<column_definitions>)
      [COMPRESSION OFF FOR ROWS WHEN (<conditions>)]

<conditions>::=<condition> [OR <conditions>]
<condition>::=<column operator constant> |
              <column operator constant> UNLESS COMPRESSION RATIO >= constant |
              <column operator constant> AND COMPRESSION RATIO < constant |
              COMPRESSION RATIO < constant ┌─ 130
CREATE TABLE ...
      ALGOCOMPRESS gzip
      ALGODECOMPRESS ungzip
      (c1, c2, ... c100)
      COMPRESSION OFF FOR ROWS WHEN(
            (col_state = 'California' and col_date >= '2009-01-01')
                  OR
            (col_date >= DATE '2009-01-01' AND col_region = 'West Coast'
            UNLESS COMPRESSION RATIO > 0.67 )
                  OR                                                        ├─ 134
            (col_date >= DATE '2008-01-01' AND col_date < DATE '2009-01-01'
            AND COMPRESSION RATIO < 0.33)
                  OR
            (COMPRESSION RATIO < 0.20)
```

*FIG. 1*

DATABASE COMPRESSION

COPYRIGHT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the example code, screen shots, and images described below, and in any drawings appended hereto: Copyright© 2010 Teradata, Inc. of Miamisburg, Ohio—All Rights Reserved.

BACKGROUND

It is not uncommon to see the amount of data associated with a business venture grow at an exponential pace. Thus, a variety of techniques to compress large amounts of data have been developed in an attempt to conserve storage resources. While algorithmic data compression may operate to reduce database table storage space and input/output (I/O) access cycle time, these benefits may come at the cost of increased processing effort to decompress the compressed data when queries are made, or when the data values are updated.

BRIEF DESCRIPTION OF THE DRAWINGS

FIG. 1 illustrates how selective compression rules can be implemented using data definition language (DDL) statements according to various embodiments of the invention.

DETAILED DESCRIPTION

Figure 2:
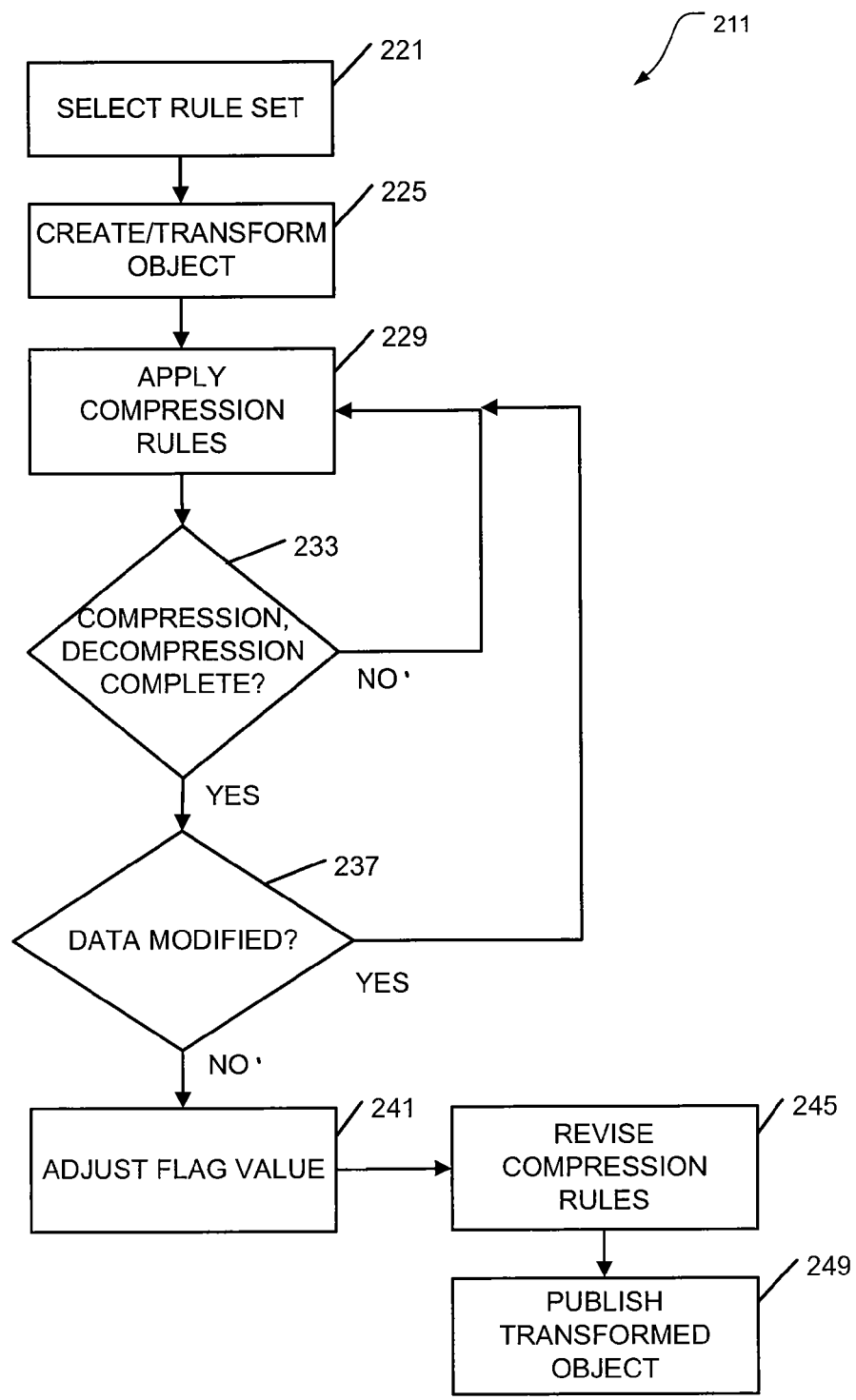
FIG. 2 is a flow diagram illustrating several methods of database compression according to various embodiments of the invention.

In large database objects (e.g., corporate database tables), it is often the case that only a portion of the data is frequently accessed as part of day-to-day business operations. For example, this can occur when a temporal database table has some rows that are queried and updated fairly often (e.g., those that contain current fiscal year data), whereas other, older rows (e.g., that contain archival data from past years) are more rarely visited.

Consider, as another example, the case of a non-temporal database table used by a credit card company to support their customer service call center operations. When a client calls into the center, the client is often prompted to choose a reason for their call, e.g. whether the call is to obtain balance information, make a billing address change, or to file a complaint. For complaints, the company may revisit the records multiple times, following-up on the client's request. But for other types of calls (e.g., a change of address), the records may never be accessed again. To avoid the time taken for decompression during common access activities, the company may choose to compress all records, except for those associated with complaints. Thus, it can be useful to choose whether compression is employed on certain groups of data based on individual business operation access patterns.

The amount of compression supported by a table often depends on how much each row in the table can be compressed. Since some compression algorithms are sensitive to the patterns present in the data itself, different rows may have different compression ratios. For example, if a table has many columns of decimal data, and some rows have repeating values over many columns, the compression ratio can be high. On the other hand, when rows have random values distributed over a large number of columns, the compression ratio may be relatively low. In general, when compression ratios are low, it may not be desirable to store a compressed version of the data that is decompressed each time the data is accessed. Thus, it can be useful to establish a lower compression ratio threshold, which establishes the point at which data compression is not used, and the data is stored in its original form.

When conditional (e.g., row-based) compression is enabled, perhaps according to business operation access patterns and/or compression thresholds, the resulting transformed database object and its items of data (e.g., rows in a transformed database table) may contain both compressed data and uncompressed data. For example, some items may be compressed, and others may not be compressed. In this case, a flag associated with each group of data (e.g., one flag per row) may be used to indicate whether a particular group of data is compressed, or not.

In some embodiments, business operation access patterns and thresholds are considered together when determining whether or not particular portions of an item will be compressed. For example, suppose table_1 is accessed, on average, once per SQL (structured query language) statement as part of a customer's business operations. In addition, suppose another table, table_2, is joined or sub-queried many times, on average, for each SQL statement.

While the compression/decompression cost for table_1 may not be very significant, because it is accessed once per SQL statement, query/update operations conducted with respect to table_2 might dramatically affect performance, due to multiple accesses for each SQL statement. In other words, it may be useful to apply compression and decompression to selected rows of table_2 when those rows satisfy certain business operation access conditions, or when the realized compression ratio is higher than some lower threshold that has been previously selected. Thus, applying compression differently between the tables may lead to a more efficient operation, with increased customer access satisfaction.

In accordance with these principles, and to address some of the challenges described above, many embodiments operate to provide an algorithmic compression syntax that can be applied to various database objects, such as tables. This may be provided in the form of enhanced SQL DDL statements, such as the CREATE TABLE and ALTER TABLE DDL statements, for example. Similarly, data manipulation language (DML) statements, such as the INSERT and UPDATE DML statements, can also be enhanced to perform compression and decompression differently, according to rules formed by defined conditions.

FIG. 1 illustrates how selective compression rules can be implemented using DDL statements 110, 120, 130 according to various embodiments of the invention. The statements 110, 120 illustrate potential placeholder formats that can be used for model CREATE TABLE and ALTER TABLE DDL statements, respectively. Statement 130 is a model CREATE TABLE statement which includes specific values to direct the creation of a table according to a set 134 of defined compression rules.

In some embodiments, when a database object is created with the ALGOCOMPRESS or ALGODECOMPRESS options, all the items in the object (e.g., rows in a table) may be subject to algorithmic compression by default. The syntax of the command may be enhanced to turn off compression for certain groups of data (e.g., selected rows) as long as the data satisfies defined conditions. These conditions may be specified in a COMPRESSION OFF clause, forming part of the statement. Similarly, in some embodiments, all rows in the table to be created may be stored uncompressed by default, for example, with rows to be compressed defined in conditions attached to the statement.

Using the COMPRESSION OFF clause, different conditions can be imposed on multiple columns. As each item is processed, these conditions can be individually evaluated. Each condition expression can be viewed as a predicate that indicates whether compression should be performed for an item, or whether compression that has already been accomplished should be canceled.

Referring now to statement 130, several useful examples of customized compression will be described. In many embodiments, the explanation of each example implies corresponding changes to INSERT and UPDATE statements, to support conditional (e.g., row-level) compression. In the case of the following examples, which describe four COMPRESSION OFF clause conditions of statement 130, an increasing amount of compression/decompression for groups of rows is specified, so that more compression is applied with respect to data that is less important to daily business operations, such as data that is accessed less and less frequently.

Consider the first condition:

COMPRESSION OFF FOR ROWS WHEN
(col_state = 'California' and col_date >= '2009-01-01')

This condition can operate to turn off the compression for rows with (col_state='California' and col_date>='2009-01-01') without any regard for the amount of compression (e.g., the compression ratio) that might be achieved for this data. The business situation for this condition might be that these rows are accessed relatively often, and the cost of compression/decompression will simply not be tolerated. Thus, when processing a row in the table that satisfies this condition, no compression will be performed. The compression flag associated with the row might be set to '0' (i.e., zero). Later, whenever this row is accessed, no decompression is needed, so that system access performance will be high.

Consider the next condition:

COMPRESSION OFF FOR ROWS WHEN
(col_date >= DATE '2009-01-01' AND col_region =
'West Coast' UNLESS COMPRESSION RATIO > 0.67)

This condition can operate to turn off compression for the rows with col_date>='2009-01-01' and col_region='West Coast', excluding qualified rows with a compression ratio above 0.67. This condition might be imposed on a group of rows that is accessed fairly often, so that decompression for every access might be undesirable. The tradeoff in this case is that when the compression ratio exceeds 0.67, a performance penalty is taken in exchange for the savings in storage, or perhaps the penalty will be paid in return for the I/O operations saved when a smaller amount of compressed data is read/written. Thus, for a qualified row (e.g., a row that meets the conditions with respect to data and region), compression will be performed, and if the realized ratio is higher than the threshold, the compressed data will be stored in the table, and the compression flag might be set to '1' (i.e., one). However, if the realized ratio is less than or equal to the designated value, compression is canceled and the original data is stored in the table, with compression flag set to '0' (indicating that no compression has been performed).

Consider the next condition:

COMPRESSION OFF FOR ROWS WHEN
(col_date >= DATE '2008-01-01' AND
col_date < DATE '2009-01-01'
AND COMPRESSION RATIO < 0.33)

This condition can operate to turn off compression for any row associated with a data value of between '2008-01-01' and '2009-01-01' if the realized compression ratio is less than 0.33. This condition might be imposed on a group of rows that is accessed less often than the previous example (so that the cost of compression/decompression is generally more tolerable). Thus, most rows in this case will be good candidates for compression. However, if the compression ratio on a qualified row (e.g., a row that meets the date requirements) is less than 0.33, compression will not be implemented, because it is not an attractive proposition (e.g., due to insufficient reduction in storage used by the compressed data). A flag indicating that the associated data is not compressed can be set accordingly.

Consider the final condition:

COMPRESSION OFF FOR ROWS WHEN
(COMPRESSION RATIO < 0.20)

This condition can operate to turn off compression when the compression ratio for a row is lower than the minimum acceptable level of a specific application, such as a call center application where access is infrequent, and storage is relatively expensive.

A more comprehensive example may be obtained by combining all of the previous examples into a single statement, as is shown in statement 130. In this case, the statement specifies that the "gzip" algorithm will be used to compress table rows, that the "ungzip" algorithm will be used to decompress compressed rows, and that by default, every row is subjected to compression. However, if a row can satisfy any one of the four conditions expressed in the statement, compression on that row will be turned off. The conditions are evaluated in the order that they are specified. Thus, for each row, the set 134 of conditions are evaluated, in order:

1) If the row has data associated with California that is dated after Jan. 1, 2009, no compression/decompression will be imposed.
2) If the row has data associated with other states in the United States West Coast area that is dated after Jan. 1, 2009, compression also turned off, unless the data can be compressed by more than 67%.
3) If the row has data associated with any state that is dated between Jan. 1, 2008 and Jan. 1, 2009, it will be compressed unless the ratio that can be achieved is less than 33%.
4) All remaining rows will be compressed, unless the realizable compression ratio is less than 20%. For these low ratios, uncompressed data will be stored in the table.

The ALTER TABLE statement 120 can be used to customize the compression effort for an existing table. For example, if some rows in a table have already been compressed according to prior COMPRESSION OFF conditions, then there are at least two choices available to deal with such rows: leave them alone (so that ALTER TABLE conditions will be imposed only on rows that are later inserted or updated); or re-do compression for all existing rows according to the ALTER TABLE statement.

In some embodiments, a byte in each row can be used to store the current compression ratio for that row. For example, a value of 67 stored in this byte might indicate the current compression ratio for that row is 0.67 or 67%. This feature may be used to avoid re-compressing the data, when the later-used ALTER TABLE statement only operates to change the threshold ratio that is imposed via compression conditions.

To summarize, various embodiments can provide a set of ordered, user-selected compression rules that can be used to turn off compression for selected groups of data in a database object, such as rows in a database table. The rules may take at least three forms: a value condition on one or more columns, a compression ratio threshold condition, or a combination of both. When rows are inserted or updated, these rows can be evaluated against the rules in the set, in the order that they are presented (e.g., in the CREATE TABLE or ALTER TABLE statement). Once a row is qualified by a rule, compression may be turned off for that row. With this mechanism, users can selectively compress groups of data to provide greater access efficiency and user satisfaction.

Thus, many embodiments of the invention may be realized, and each can be implemented in a variety of architectural platforms, along with various operating and server systems, devices, and applications. Any particular architectural layout or implementation presented herein is therefore provided for purposes of illustration and comprehension only, and is not intended to limit the various embodiments.

FIG. 2 is a flow diagram illustrating several methods 211 of database compression according to various embodiments of the invention. The methods 211 are implemented in a machine-accessible and readable medium, and are operational over processes within and among networks. The networks may be wired, wireless, or a combination of wired and wireless. The methods 211 may be implemented as instructions, which when accessed by a specific machine, perform the processing depicted in FIG. 2.

In some embodiments, the method 211 may comprise a processor-implemented method to execute on one or more processors that perform the method. The method 211 may begin at block 221 with selecting a set of compression rules. This may include, for example, receiving a set of ordered user-selected compression rules as a compression rule set comprising at least one compression threshold condition. One or more additional conditions may be imposed, such as a column condition (e.g., a selected column value), a second compression ratio, or a measured frequency of access.

The method 211 may continue on to block 225 with creating or transforming a database object with rows to be selectively compressed according to the compression rules in the compression rule set. The result is a new, transformed database object.

DDL statements can be used to initiate selective compression operations for the object. Thus, the activities of creating and/or transforming may be initiated using DDL statements. For example, a group of ordered, user-selected compression rules may be included as the compression rule set in DDL statements.

As part of the activities of creation and/or transformation, various compression rules in the set may be applied at block 229. For example, compression can be turned off/on for a particular row according to the order that the compression rules are presented in the set. Thus, the activity at block 229 may comprise turning off compression of some of the rows according to an order of presentation of the compression rules in the compression set.

In some embodiments, compression can be based on a number of conditions, such as a column condition. For example, compression may be enabled or disabled based on the magnitude of values stored in a column. Thus, one or more of the compression rules in the compression rule set may comprise turning off compression or turning on compression of some of the rows when a column condition associated with data to be stored in the object is met.

The compression rules can therefore include a value condition on one or more columns, multiple compression thresholds, and a combination of value conditions and threshold conditions. Thus, the compression rules in the compression rule set may comprise a combination of the compression threshold condition and a column condition associated with data to be stored in the object.

The set of compression rules can be stored in a header associated with the database object, such as the table header of a database table. These rules are then held as common information for all compressible items (e.g., rows) in that object (e.g., a table). If a rule contains a compression ratio threshold, the threshold can also be stored in the header and this compression ratio threshold may be applied to all items targeted by that rule, through its value condition (or for all items in the object if there is no value condition, as is the case with the example condition that applies a ratio of 0.20, described above).

Multiple thresholds may be specified as part of the compression conditions. Thus, there might be multiple compression ratio thresholds which will be applied to rows in different groups targeted by the compression rules. Therefore, in some embodiments, one or more of the compression rules may comprise a combination of the compression threshold condition and at least one other condition (e.g., a column condition, an additional threshold condition, etc.)

In some embodiments, a default condition associated with the items in the database object (e.g., rows in a table) is compression, unless the compression is turned off according to the compression rules. Once the compression or decompression of the database object is complete, as determined at block 233, then the method 211 may continue on to block 237. Otherwise, the method 211 may return to block 229, with continued application of the set of compression rules.

For example, compression can be conditioned on the type of processing technology available (e.g., single processor vs. multi-core), or storage medium technology that will be used (e.g., physical disk vs. solid-state disk). Slower technologies may be specified in conjunction with lower compression thresholds, and faster technologies in conjunction with higher compression thresholds. Thus, one or more of the compression rules may comprise a technology associated with processing data in the object, or the storage medium.

Compression can be turned off for rows that have data that is accessed more frequently than some selected amount. Thus, one or more of the compression rules may comprise turning off compression for a row in the object having data that is associated with more frequent access than some selected number of accesses per unit time, or per SQL statement.

At block 237, the method 211 may include determining whether data in the database object has been modified, such as alteration of a row in a database table. If so, then the compression rules may be re-applied, as noted for block 229. If not, the method 211 may continue on to block 241.

A flag can be used to determine whether a row has been compressed and if so, how much the row has been compressed. The flag may comprise information (e.g., a byte) in the row header of each row. Thus, the method 211 may include, at block 241, adjusting the value of a flag for a row in the object to indicate that the row has been compressed.

The compression flag might be stored for each item (e.g., in each row) and used to indicate the compression ratio for that single item (e.g., row). For example, if the value of the flag is equal to zero or a negative number, this might mean that the item has not been compressed. If the value of the flag is a positive integer between 1 and 99, for example 30, that might means the item has been compressed, and that the compression ratio for the item is 30%. The flag may be updated when a row is compressed after being INSERTed or UPDATEd, via DML statements. Thus, the activity of adjusting at block 241 may comprise adjusting the value of the flag to indicate an approximate value of a compression ratio of a row in the object when the row is compressed.

In some embodiments, the flag can also be used to determine whether decompression will be applied to rows when they are accessed. Therefore, the method 211 may further comprise receiving a query, executing the query to access an item in the object (e.g., a row in a database table), and decompressing the item in the object only when the value of the flag indicates the row has been compressed.

DML statements may operate to change the content of the object, and the changed content can in turn affect how compression will be applied to the object (in accordance with the compression rules). Thus, the method 211 may continue on to block 245 to include revising selective compression of the rows according to the compression rules in response to the use of data manipulation language (DML) INSERT and UPDATE statements that operate to modify data in the rows.

ALTER TABLE DDL statements may also operate to customize compression for an existing table. Compression for some rows may thus be revised, depending on a new set of compression rules introduced by the ALTER TABLE statement. There are two strategies for this revision.

The first strategy may function to aggressively perform compression according to the new compression rules in a real-time mode. The ALTER TABLE DDL statement may therefore operate to scan all the existing rows in a table and re-evaluate each row against each compression rule. If a new rule turns off compression for a row that has previously been compressed, the row can be de-compressed and replaced with an un-compressed version of the data. If no rule applies to turn off compression, and the data is not yet compressed, then the data in that row will be compressed and the compressed form will be stored in the table.

The second strategy may be called a "lazy mode" of operation. In this case, the table header might be updated with a new set of compression rules when the ALTER TABLE statement is issued. However, each row is not re-evaluated or changed at that time. Rather, when an existing row is later updated with new content, then that row is evaluated against the new set of compression rules, and compressed/decompressed accordingly. The new compression rules will be applied to any new row at the time that the new row is inserted, substantially in real time. Re-evaluating the compression of rows based on ALTER TABLE processing may thus save system resources, based on observing the condition of the compression flag (which can be set to indicate the current compression ratio). Therefore, in some embodiments data items in an object are not probed using trial compression to determine the potential ratio that might be achieved.

As a result, the activity at block 245 may comprise receiving a request to revise compression of some of the rows in a table (or other items in a database object), the request being associated with one or more new compression rules; and refraining from revising the compression of the rows when the new compression rule(s) disqualify the rows from compression, and these rows have not been compressed previously according to the old rules.

The method 211 may continue on to block 249 to include publishing at least a portion of the transformed object (e.g., a created or altered table) to one of a storage medium or a display screen.

The methods described herein do not have to be executed in the order described, or in any particular order. Moreover, various activities described with respect to the methods identified herein can be executed in repetitive, serial, or parallel fashion. The individual activities of the methods shown in FIG. 2 can also be combined with each other and/or substituted, one for another, in various ways. Information, including parameters, commands, operands, and other data, can be sent and received in the form of one or more carrier waves. Thus, many other embodiments may be realized.

The methods shown in FIG. 2 can be implemented in various devices, as well as in a computer-readable storage medium, where the methods are adapted to be executed by one or more processors. Further details of such embodiments will now be described.

Figure 3:
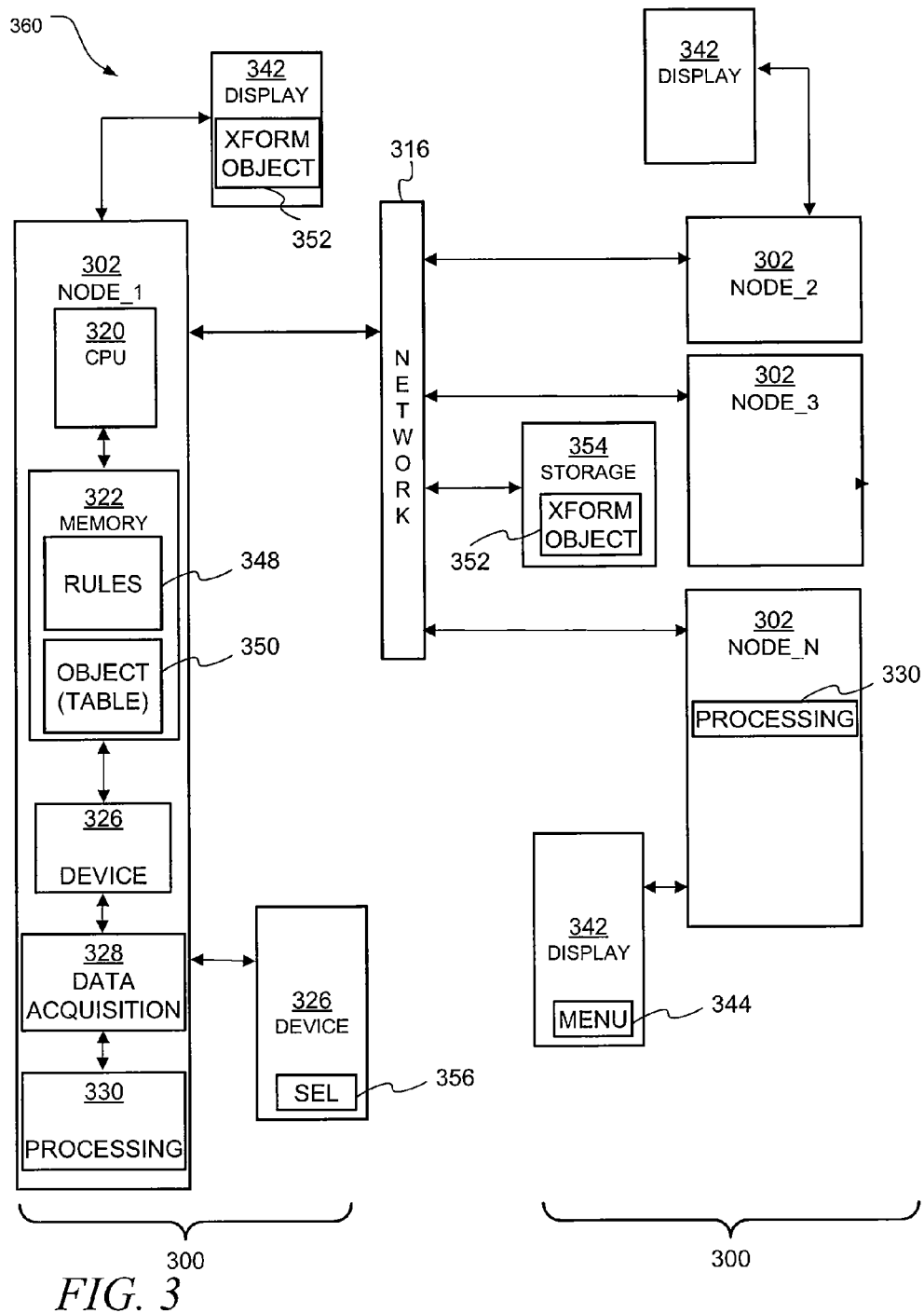
FIG. 3 is a block diagram of apparatus and systems according to various embodiments of the invention.

FIG. 3 is a block diagram of apparatus 300 and systems 360 according to various embodiments of the invention. Here it can be seen that an apparatus 300 used to implement database compression may comprise one or more processing nodes 302, one or more processors 320, memories 322, one or more user input devices 326, a data acquisition module 328, a processing module 330, and one or more displays 342. The apparatus 300 may comprise a client, a server, or a networked processing node.

The processing nodes 302 may in turn comprise physical machines or virtual machines, or a mixture of both. The nodes 302 may also comprise networked entities, such servers and/or clients. In some cases, the operations described herein can occur entirely within a single node 302.

In some embodiments then, an apparatus 300 may comprise a data acquisition module 328 to receive a set of ordered user-selected compression rules 348 as a compression rule set comprising at least one compression threshold condition. The apparatus 300 may also comprise a processing module 330 to create or transform a database object 350 with rows to be selectively compressed according to the compression rules 348 in the compression rule set, providing a transformed object 352, and to publish at least a portion of the transformed object 352 to one of a storage medium (e.g., housed in a storage node 354) or the screen of a display 342. The apparatus 300 may thus comprise a storage node 354 that includes the storage medium.

The display 342 may be used to present row-based views of the transformed object to an end user, as well as a menu of conditions for compression. Thus, the apparatus 300 may comprise one or more displays 342 to include a display screen and to display the rows (or other items) of the transformed object 352 and/or a menu 344 of the compression rules 348.

The apparatus may divide its workload between multiple nodes. Thus, the apparatus 300 may comprise a first node (e.g., NODE_1) to house the data acquisition module 328, and a second node (e.g., NODE_N) to house the processing module 330.

A user input device 326 may be used by an end-user to select the compression rules. Thus, the apparatus 300 may comprise a user input device 326 to transmit a selection 356 of at least some of the compression rules 348 to the data acquisition module 328.

Still further embodiments may be realized. For example, it can be seen that a system 360 that operates to implement data object transformation may comprise multiple instances of the apparatus 300. The system 360 might also comprise a cluster of nodes 302, including physical and virtual nodes. It should be noted that any of the nodes 302 may include any one or more of the elements explicitly shown in nodes NODE_1, NODE_2, NODE_3, . . . NODE_N.

The apparatus 300 and systems 360 may be implemented in a machine-accessible and readable medium that is operational over one or more networks 316. The networks 316 may be wired, wireless, or a combination of wired and wireless. The apparatus 300 and system 360 can be used to implement, among other things, the processing associated with the methods 211 of FIG. 2. Modules may comprise hardware, software, and firmware, or any combination of these. Additional embodiments may be realized.

Figure 4:
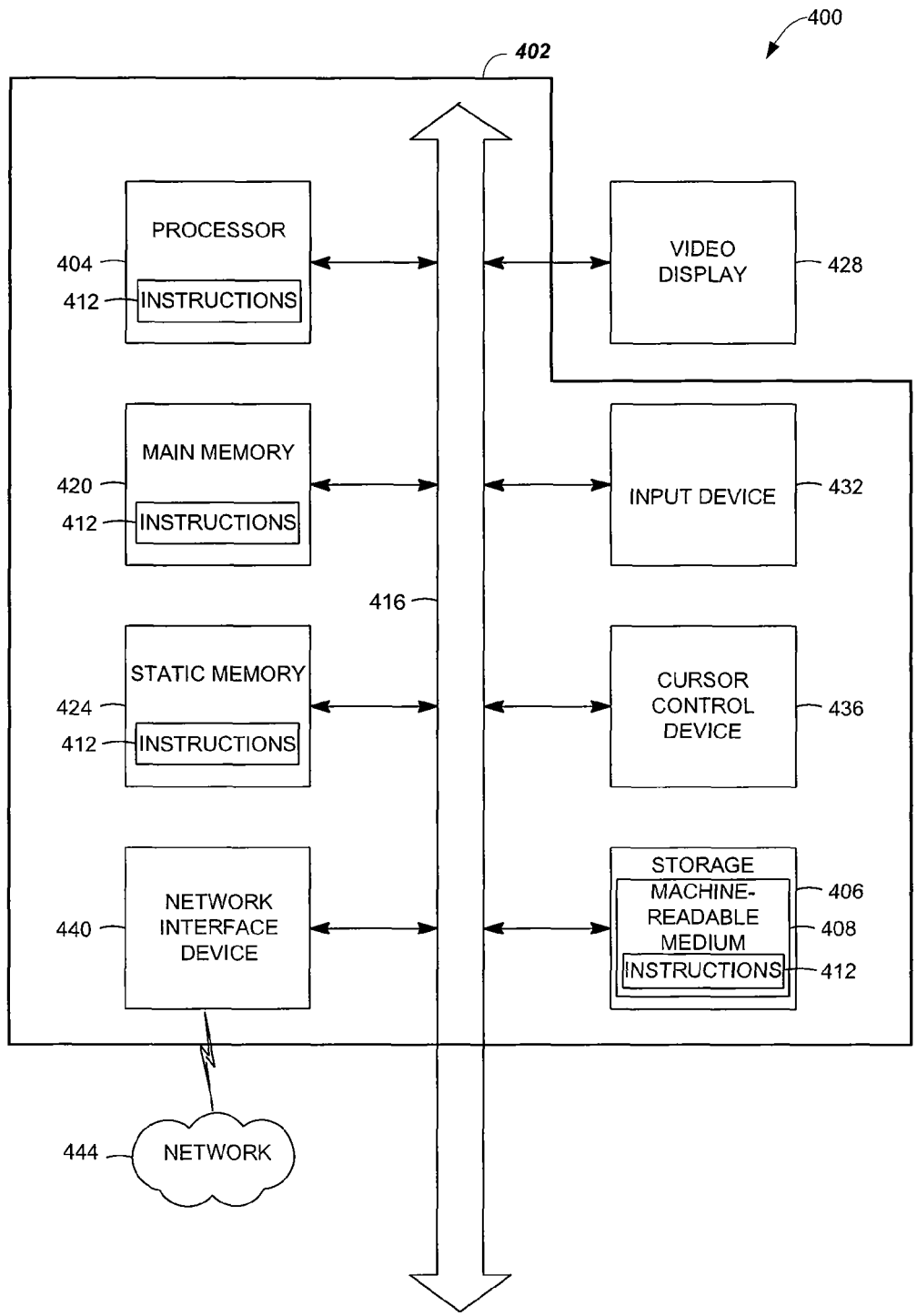
FIG. 4 is a block diagram of an article of manufacture, including a specific machine, according to various embodiments of the invention.

For example, FIG. 4 is a block diagram of an article 400 of manufacture, including a specific machine 402, according to various embodiments of the invention. Upon reading and comprehending the content of this disclosure, one of ordinary skill in the art will understand the manner in which a software program can be launched from a computer-readable medium in a computer-based system to execute the functions defined in the software program.

One of ordinary skill in the art will further understand the various programming languages that may be employed to create one or more software programs designed to implement and perform the methods disclosed herein. The programs may be structured in an object-oriented format using an object-oriented language such as Java or C++. Alternatively, the programs can be structured in a procedure-oriented format using a procedural language, such as assembly or C. The software components may communicate using any of a number of mechanisms well known to those of ordinary skill in the art, such as application program interfaces or interprocess communication techniques, including remote procedure calls. The teachings of various embodiments are not limited to any particular programming language or environment. Thus, other embodiments may be realized.

For example, an article 400 of manufacture, such as a computer, a memory system, a magnetic or optical disk, some other storage device, and/or any type of electronic device or system may include one or more processors 404 coupled to a machine-readable medium 408 such as a memory (e.g., removable storage media, as well as any memory including an electrical, optical, or electromagnetic conductor) having instructions 412 stored thereon (e.g., computer program instructions), which when executed by the one or more processors 404 result in the machine 402 performing any of the actions described with respect to the methods above.

The machine 402 may take the form of a specific computer system having a processor 404 coupled to a number of components directly, and/or using a bus 416. Thus, the machine 402 may be similar to or identical to the apparatus 300 or system 360 shown in FIG. 3.

Turning now to FIG. 4, it can be seen that the components of the machine 402 may include main memory 420, static or non-volatile memory 424, and mass storage 406. Other components coupled to the processor 404 may include an input device 432, such as a keyboard, or a cursor control device 436, such as a mouse. An output device 428, such as a video display, may be located apart from the machine 402 (as shown), or made as an integral part of the machine 402.

A network interface device 440 to couple the processor 404 and other components to a network 444 may also be coupled to the bus 416. The instructions 412 may be transmitted or received over the network 444 via the network interface device 440 utilizing any one of a number of well-known transfer protocols (e.g., HyperText Transfer Protocol). Any of these elements coupled to the bus 416 may be absent, present singly, or present in plural numbers, depending on the specific embodiment to be realized.

The processor 404, the memories 420, 424, and the storage device 406 may each include instructions 412 which, when executed, cause the machine 402 to perform any one or more of the methods described herein. In some embodiments, the machine 402 operates as a standalone device or may be connected (e.g., networked) to other machines. In a networked environment, the machine 402 may operate in the capacity of a server or a client machine in server-client network environment, or as a peer machine in a peer-to-peer (or distributed) network environment.

The machine 402 may comprise a personal computer (PC), a tablet PC, a set-top box (STB), a PDA, a cellular telephone, a web appliance, a network router, switch or bridge, server, client, or any specific machine capable of executing a set of instructions (sequential or otherwise) that direct actions to be taken by that machine to implement the methods and functions described herein. Further, while only a single machine 402 is illustrated, the term "machine" shall also be taken to include any collection of machines that individually or jointly execute a set (or multiple sets) of instructions to perform any one or more of the methodologies discussed herein.

While the machine-readable medium 408 is shown as a single medium, the term "machine-readable medium" should be taken to include a single medium or multiple media (e.g., a centralized or distributed database, and/or associated caches and servers, and or a variety of storage media, such as the registers of the processor 404, memories 420, 424, and the storage device 406 that store the one or more sets of instructions 412). The term "machine-readable medium" shall also be taken to include any medium that is capable of storing, encoding or carrying a set of instructions for execution by the machine and that cause the machine 402 to perform any one or more of the methodologies of the present invention, or that is capable of storing, encoding or carrying data structures utilized by or associated with such a set of instructions. The terms "machine-readable medium" or "computer-readable medium" shall accordingly be taken to include tangible media, such as solid-state memories and optical and magnetic media.

Various embodiments may be implemented as a standalone application (e.g., without any network capabilities), a client-server application or a peer-to-peer (or distributed) application. Embodiments may also, for example, be deployed by Software-as-a-Service (SaaS), an Application Service Provider (ASP), or utility computing providers, in addition to being sold or licensed via traditional channels.

Implementing the apparatus, systems, and methods described herein may operate to allow database processing customers to customize the manner in which compression/decompression is applied to various database objects, such as tables, perhaps at the row level. In this way, there is more flexibility to trade off the benefits and costs related to compression. Once a preferred configuration is established, the performance of queries and DML statements on the affected objects may be enhanced, while still achieving a certain level of compression. Increased efficiency and user satisfaction may result.

This Detailed Description is illustrative, and not restrictive. Many other embodiments will be apparent to those of ordinary skill in the art upon reviewing this disclosure. The scope of embodiments should therefore be determined with reference to the appended claims, along with the full scope of equivalents to which such claims are entitled.

The Abstract of the Disclosure is provided to comply with 37 C.F.R. §1.72(b) and will allow the reader to quickly ascertain the nature of the technical disclosure. It is submitted with the understanding that it will not be used to interpret or limit the scope or meaning of the claims.

In this Detailed Description of various embodiments, a number of features are grouped together in a single embodiment for the purpose of streamlining the disclosure. This method of disclosure is not to be interpreted as an implication that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
an array of processing nodes;
a data acquisition module executable by the array of processing nodes to receive a set of ordered user-selected compression rules as a compression rule set comprising at least one compression ratio threshold and at least one condition based on database object content; and
a processing module executable by the array of processing nodes to:
determine a compression ratio of at least one column of a row of a database object;
determine content of at least one column of the row of the database object;
create or transform the row of the database object according to the compression rules in the compression rule set to provide a transformed object, wherein the creation or transformation of the row of the database object includes selective compression of the row in response to comparison of the determined compression ratio to the compression ratio threshold and in response to comparison of the determined content to the at least one condition based on database object content; and
publish at least a portion of the transformed object to one of a tangible storage medium or a display screen.

2. The apparatus of claim 1, further comprising:
a display to include the display screen and to display the rows of the transformed object and/or a menu of the compression rules.

3. The apparatus of claim 1, further comprising:
a storage node that includes the tangible storage medium.

4. The apparatus of claim 1, wherein the array of processing nodes comprises a first processing node and a second processing node, wherein the data acquisition module is executable by the first processing node, and wherein the processing module is executable by the second processing node.

5. The apparatus of claim 1, further comprising:
a user input device to transmit a selection of at least some of the compression rules to the data acquisition module.

6. A processor-implemented method to execute on one or more processors that perform the method, comprising:
receiving a set of ordered user-selected compression rules as a compression rule set comprising at least one compression ratio threshold and at least one compression condition based on database object content;
determining a compression ratio of at least one column of a row of a database object;
determining content of at least one column of the row of the database object;
creating or transforming the row of the database object according to the compression rules in the compression rule set to provide a transformed object, wherein the creating or transforming of the row of the database object includes selective compression of the row in response to comparison of the determined compression ratio to the compression ratio threshold and in response to comparison of the determined content to the at least one condition based on database object content; and
publishing at least a portion of the transformed object to one of a tangible storage medium or a display screen.

7. The method of claim 6, further comprising:
turning off compression of some of the rows according to an order of presentation of the compression rules in the compression set.

8. The method of claim 6, wherein one of the compression rules in the compression rule set comprises turning off compression or turning on compression of the row in response to comparison of the determined content to the at least one condition based on database object content.

9. The method of claim 6, further comprising:
adjusting a value of a flag for the row in the transformed object to indicate the row has been compressed.

10. The method of claim 9, further comprising:
receiving a query;
executing the query to access the row; and
decompressing the row in the transformed object only when the value of the flag indicates the row has been compressed.

11. The method of claim 9, wherein the adjusting comprises:
adjusting the value of the flag to indicate an approximate value of a compression ratio of the row in the transformed object when the row is compressed.

12. The method of claim 6, wherein the creating or the transforming are accomplished using data definition language (DDL) statements.

13. A non-transitory computer-readable medium encoded with a plurality of instructions executable by a processor, the plurality of instructions comprising: instructions to receive a set of ordered user-selected compression rules in data definition language statements as a compression rule set comprising at least one compression ratio threshold and at least one condition based on database object content;
instructions to determine a compression ratio of at least one column of a row of a database object;
instructions to determine content of at least one column of the row of the database object;
instructions to create or transform the row of the database object according to the compression rules in the compression rule set to provide a transformed object, wherein the instructions to create or transform of the row of the database object includes instructions to selectively compress the row in response to comparison of the determined compression ratio to the compression ratio threshold and in response to comparison of the determined content to the at least one condition based on database object content; and instructions to publish at least a portion of the transformed object to one of a tangible storage medium or a display screen.

14. The non-transitory computer-readable medium of claim 13, wherein the plurality of instructions further comprises instructions to revise selective compression of the row according to the compression rules in response to the use of data manipulation language (DML) INSERT and UPDATE statements that operate to modify data in the row.

15. The non-transitory computer-readable medium of claim 13, wherein a default condition associated with the row is compression, unless the compression is turned off according to the compression rules.

16. The non-transitory computer-readable medium of claim 15, wherein the plurality of instructions further comprises instructions to receive a request to revise compression of some of additional rows of the database object, the request associated with at least one new compression rule; and instructions to refrain from revising the compression of the some of the additional rows when the at least one new compression rule disqualifies the some of the rows from compression, and when the some of the rows have not been compressed previously according to old rules.

17. The non-transitory computer-readable medium of claim 13, wherein at least one of the compression rules comprises a technology associated with processing data in the database object, or the tangible storage medium.

18. The non-transitory computer-readable medium of claim 13, wherein at least one of the compression rules comprises a turning off of compression for the row in the database object in response to the row having data that is associated with more frequent access than some selected number of accesses per unit time, or per structured query language statement.

* * * * *